United States Patent [19]

Honda

[11] Patent Number: 5,565,304
[45] Date of Patent: *Oct. 15, 1996

[54] CHEMICALLY AMPLIFIED RADIATION-SENSITIVE COMPOSITION USED IN A PROCESS FOR FABRICATING A SEMICONDUCTOR DEVICE

[75] Inventor: Kenji Honda, Barrington, R.I.

[73] Assignee: OCG Microelectronic Materials, Inc., Cheshire, Conn.

[*] Notice: The term of this patent shall not extend beyond the expiration date of Pat. No. 5,340,687.

[21] Appl. No.: 463,251

[22] Filed: Jun. 5, 1995

Related U.S. Application Data

[60] Division of Ser. No. 292,899, Aug. 19, 1994, which is a continuation-in-part of Ser. No. 879,021, May 6, 1992, Pat. No. 5,340,687.

[51] Int. Cl.$^6$ .................................................. G03C 7/06
[52] U.S. Cl. ........................ 430/311; 430/270.1; 430/326; 430/905
[58] Field of Search ................................ 430/311, 325, 430/326, 270.1, 905

[56] References Cited

U.S. PATENT DOCUMENTS

| | | | |
|---|---|---|---|
| 2,994,686 | 8/1961 | Hauptschein | 528/212 |
| 3,318,658 | 5/1967 | Leahy et al. | 8/115.56 |
| 3,625,919 | 12/1971 | Kamogawa et al. | 260/474 |
| 3,869,292 | 3/1975 | Peters | 430/192 |
| 4,032,513 | 6/1977 | Fujiwara et al. | 260/47 UA |
| 4,376,000 | 3/1983 | Lindert | 427/388.4 |
| 4,409,317 | 10/1983 | Shiraishi | 430/270 |
| 4,433,015 | 2/1984 | Lindert | 427/388.4 |
| 4,439,516 | 3/1984 | Cernigliaro et al. | 430/192 |
| 4,457,790 | 7/1984 | Lindert et al. | 148/6.15 R |

(List continued on next page.)

FOREIGN PATENT DOCUMENTS

| | | |
|---|---|---|
| 307752 | of 1989 | European Pat. Off. . |
| 425891 | 5/1991 | European Pat. Off. . |
| 459260 | 12/1991 | European Pat. Off. . |
| 558280 | 9/1993 | European Pat. Off. . |
| 5-043641 | 2/1993 | Japan . |
| 5-045878 | 2/1993 | Japan . |
| 5-107763 | 4/1993 | Japan . |

OTHER PUBLICATIONS

Honda et al., "Dissolution Behavior of the Chemically Modified Polyvinylphenol with Introduced High–Ortho Structure; Proc. Spie Int. Soc. Opt. Eng.".
Search Report for EP 9530 5402 "Advances in Resist Technology and Processing XI"; San Jose, Calif. vol. 2195, 28 Feb. 1994—1 Mar. 1994, pp. 524–541.
Proc. 4th Micro Process Conference, Kanazawa, Jap., Jul. 15–18, 1991, Section A–7–3 Article "Dissolution Inhibition of Phenolic Resins by Diazonaphthoquinone: Effect of Polymer Structure".
I. S. Fulsunaga, T. Kitaori, H. Koyanagi, S. Umeda & K. Nagasaiva; "Diazonaphthequionone—Sensitized Deep–UV Resist Materials", SPIE vol. 1672 Advances in Resist Technology & Processing IX (1992) pp. 647–659.
Proc. SPIE vol. 1262, Advances in Resist Technology & Processing VII, pp. 391–400 "Modified Polyhydroxystyrenes as Matrix Resins for Dissolution Inhibition Type Photoresists".
Celanese Product Information Bulletin for Poly(p–hydroxystyrene), no date.
Celanese Advaced Technology, Corpus Christi, TX.

Primary Examiner—John S. Y. Chu
Attorney, Agent, or Firm—William A. Simons

[57] ABSTRACT

A chemically amplified-type radiation-sensitive composition comprising:
(a) an alkali-soluble binder resin made by a condensation reaction of:
(i) hydroxystyrene moiety having formula [1] or [2]:

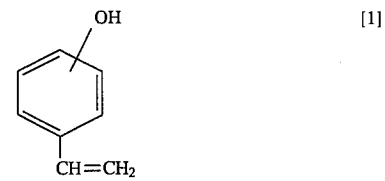

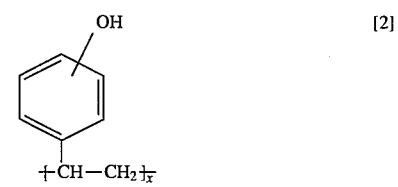

wherein x is an integer from 2 to 300; with
(ii) a monomethylolated phenolic compound having a formula [8]:

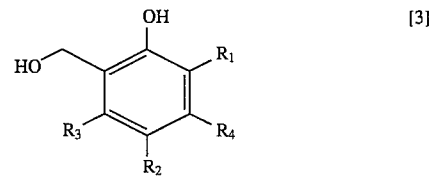

wherein $R_1$ and $R_2$ are individually selected from the group consisting of lower alkyl group having 1–4 carbon atoms, lower alkoxy group having 1–4 carbon atoms, amino group, and carboxylic acid group; wherein $R_3$ and $R_4$ are individually selected from the group consisting of hydrogen, lower alkyl group having 1–4 carbon atoms, lower alkoxy groups having 1–4 carbon atoms, an amino group, and a carboxylic group; and wherein a mole ratio of the hydroxystyrene moiety to the monomethylolated phenolic compound is from about 1:10 to about 10:1;
(b) at least one alkaline dissolution inhibitor containing acid-cleavable groups; and
(c) at least one compound that results in generation of an acidic moiety under irradiation.

12 Claims, No Drawings

U.S. PATENT DOCUMENTS

| | | | |
|---|---|---|---|
| 4,460,753 | 7/1984 | Yamamoto et al. | 528/159 |
| 4,465,768 | 8/1984 | Ueno et al. | 430/296 |
| 4,491,628 | 1/1985 | Ito et al. | 430/176 |
| 4,517,028 | 5/1985 | Lindert | 148/6.14 R |
| 4,554,237 | 11/1985 | Kataoka et al. | 430/197 |
| 4,600,683 | 7/1986 | Greco et al. | 430/270 |
| 4,614,706 | 9/1986 | Matsuzawa et al. | 430/313 |
| 4,828,958 | 5/1989 | Hayase et al. | 430/175 |
| 4,853,314 | 8/1989 | Ruckert et al. | 430/191 |
| 4,889,789 | 12/1989 | Stahlhofen | 430/191 |
| 4,988,601 | 1/1991 | Ushirogouchi et al. | 430/192 |
| 5,002,858 | 3/1991 | Demmer et al. | 430/192 |
| 5,340,687 | 8/1994 | Honda | 430/192 |

CHEMICALLY AMPLIFIED RADIATION-SENSITIVE COMPOSITION USED IN A PROCESS FOR FABRICATING A SEMICONDUCTOR DEVICE

CROSS-REFERENCE TO RELATED CASE

This application is a division of U.S. application Ser. No. 08/292,899, filed Aug. 19, 1994, and now pending, which is a Continuation-in-Part Application of U.S. patent application Ser. No. 07/879,021, filed on May 6, 1992 and now U.S. Pat. No. 5,340,687 which issued on Aug. 23, 1994. Both of these parent applications are incorporated herein by reference in their entireties.

FIELD OF THE INVENTION

The present invention relates to a chemically amplified radiation-sensitive composition useful as a photoresist composition for semiconductor device applications. In particular, the present invention relates to a chemically amplified radiation-sensitive composition which contains a specifically defined polymeric material.

DESCRIPTION OF THE PRIOR ART

The prior art is replete with numerous examples of chemically amplified types of photoresist compositions. In 1974, S. I. Schlisinger (Photogr. Sci. Eng., 18, 387) published the results of ring opening polymerization of epoxies with aromatic diazonium salts which generated Lewis acids under light illumination. These compounds which can generate acids under illumination were called a photoacid generator (PAG); since Schlisinger's report many PAG's have been synthesized for lithographic applications.

With the increasing interest in DUV exposure tools, chemically amplified resists have been attracting great interest, particularly since H. Ito et al. (U.S. Pat. No. 4,491,628) disclosed the resist consisting of a t-butoxycarbonyl (t-BOC)-protected binder resin with an onium salt type of PAG compound. This system is attractive because of its high sensitivity due to the chemical amplification mechanism, i.e., acid generated by the PAG migrates through the resist film to catalytically cleave the t-BOC groups. This results in the initially hydrophobic polymer being transformed to a hydrophilic polymer, resulting in positive tone images on development.

Today, two major types of the chemically amplified systems exist. They are either a two-component or three-component system. In the former case, hydrophobic acid-cleavable protecting groups such as t-BOC are covalently attached to the binder resin, while in the latter case, hydrophobic inhibitors containing acid-cleavable protecting groups are blended with binder resins like the diazonaphthoquinone/novolak-based photoresist system. In both cases, a PAG is required to generate acids under irradiation, which will then convert the hydrophobic film to a hydrophilic one upon post exposure bake, resulting in a positive relief image on development.

The binder resin should have a reasonably high dissolution rate. Polyhydroxystyrenes (PHS) (also known as polyvinylphenols) are one of the most commonly used binder resins for these systems. In addition to PHS resins, various other polymers with different protecting groups have been taught.

Separately, novolaks made from mixtures of m-cresol and p-cresol are particularly popular as binder resins for non-chemically amplified positive photoresist. They provide good lithographic performance with quinone diazide ester sensitizers. However, such novolak resins have some problems such as lower UV transparency at 248 nm and wider molecular weight dispersivity. In particular, the former is serious for application to deep UV photoresists.

In comparison, other types of alkaline-soluble vinyl polymers have also been considered as binder resins for Deep UV photoresists. For example, hydroxystyrene polymers, hydrolyzed styrene-maleic anhydride copolymers, styrene-maleimide copolymers, and other polymers of styrene and acrylate derivatives have been tested for lithographic performance. None of these polymers, however, are useful alone because of their extremely high solubility with poor dissolution inhibition in alkali developers used in the lithographic process. However, they still have advantages of having a narrower molecular weight distribution and a high transparency, particularly at 248 nm, compared to novolaks which results in the sharper switching of dissolution rate of the polymers in alkali developers at a threshold of exposure energy.

In the past, poly(hydroxystyrene) polymers have been modified in various ways [see Information Bulletin of Poly(p-hydroxy styrene) published by R. W. Rupp and B. N. Shah, Celanese Advanced Technology]. In particular to reduce the alkali dissolution rate of poly(hydroxystyrene) polymers, the research staff at Hoechst AG has examined alkylation of such polymers particularly at the ortho position to the hydroxyl group on the phenolic ring (EP 307–752, 1989; Proc. SPIE Vol. 1262, Advances in Resist Technology and Processing VII, 391–400, 1990). However, the resulting polymers have been reported to still have a poor dissolution inhibition with quinone diazide esters compared with conventional novolak polymers, (see Proc. 4th Micro Process Conference held at Kanazawa, Japan, July 15–18, 1991; A-7-3).

The present invention provides a way of obtaining the advantages of the cresol novolak chemistry along with the dissolution characteristics of poly(hydroxystyrene) polymers to obtain a polymer resin having a predetermined narrow molecular weight distribution. These resulting binder resins of the present invention have (1) good dissolution inhibition, (2) good discrimination in dissolution rate between exposed and unexposed areas; (3) substantially perpendicular walls of photo image, and (4) no undevelopable residues (so-called scum) in combination with an alkaline dissolution inhibitor containing acid-cleavable groups and a photosensitive acid generator.

BRIEF SUMMARY OF THE INVENTION

Accordingly, one aspect of the present invention is directed to a chemically amplified type radiation-sensitive composition comprising:
(a) an alkali-soluble binder resin made by a condensation reaction of:

(i) hydroxystyrene moiety having formulae [1] or [2]:

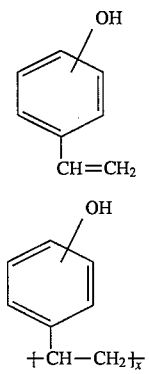

wherein x is an integer from 2 to 300; with (ii) a monomethylolated phenolic compound having a formula [3]:

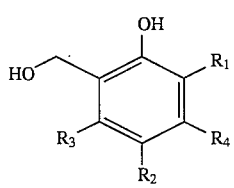

wherein $R_1$ and $R_2$ are individually selected from the group consisting of lower alkyl group having 1–4 carbon atoms, lower alkoxy group having 1–4 carbon atoms, amino group, and carboxylic acid group; wherein $R_3$ and $R_4$ are individually selected from the group consisting of hydrogen, lower alkyl group having 1–4 carbon atoms, lower alkoxy groups having 1–4 carbon atoms, an amino group, and a carboxylic group; and wherein a mole ratio of the hydroxystyrene moiety to the monomethylolated phenolic compound is from about 1:10 to about 10:1;

(b) at least one alkaline dissolution inhibitor containing acid-cleavable groups; and (c) at least one compound that results in generation of an acidic moiety under irradiation.

Another aspect of the present invention is directed to a process for fabrication of a semiconductor device comprising the steps of:

(1) forming a radiation-sensitive region on a device substrate;

(2) exposing said region to said radiation to form a pattern;

(3) developing said pattern; and (4) employing said pattern to define areas of said device; wherein said radiation-sensitive region is a radiation-sensitive composition comprising:

(a) the alkali-soluble binder resin described above;

(b) at least one alkaline dissolution inhibitor containing acid-cleavable groups; and (c) at least one compound that results in generation of an acidic moiety under irradiation.

DESCRIPTION OF THE PREFERRED EMBODIMENTS

The hydroxystyrene moieties of formula [1] are commercially available. One preferred hydroxystyrene moiety of formula [1] is para-hydroxystyrene.

The poly(hydroxystyrene) polymers of formula [2] are also commercially available. One preferred poly(hydroxystyrene) polymer of formula [2] is poly(para-hydroxystyrene) with n being from about 10 to 100. A preferred molecular weight of the poly(hydroxystyrene) is from 3,000–30,000, more preferably, 5,000–8,000.

The monomethylolated phenolic compounds of formula [3] are prepared by reacting the corresponding phenol having one unsubstituted ortho position to the hydroxyl group with formaldehyde in an alkaline medium. Suitable alkaline mediums include aqueous solution of sodium hydroxide or tetramethylammonium hydroxide. Substituent groups on the 2- and 4-positions should be small because bulky substituents may lead to the resulting polymer having a distorted conformation of the introduced methylene bridge between two adjacent phenolic rings which may lead to less effective dissolution inhibition. Lower alkyl groups having 1–2 carbon atoms or lower alkoxy groups having 1–2 carbon atoms are preferred for $R_1$ and $R_2$. Methyl group is most preferred for $R_1$ and $R_2$. Hydrogen group is most preferred for both $R_3$ and $R_4$. Thus, 2,4-dimethyl-6-methylolphenol is the most preferred monomethylolated phenolic compound. The monomethylolation reaction should preferably be controlled to avoid any further dimerization or polymerization. To do that, a large excess of formaldehyde is preferably reacted with the 2,4-substituted phenolic compounds and the reaction temperature should preferably not exceed about 70°–80° C. The reaction time for this methylation reaction is preferably 1–3 hours.

The hydroxystyrene precursors [1] or the poly(hydroxy styrene) precursors [2], particularly poly(p-hydroxy styrene), may be reacted with a monomethylolated phenolic compound of formula [3] in the presence of acid catalyst at an elevated temperature around 40°–80° C. The preferred acidic catalysts are acetic acid, oxalic acid or $H_2SO_4$. Preferably these reactions are carried out in an organic solvent which dissolves both precursors. One preferred solvent is acetic acid which can work as the catalyst as well. A preferred molar ratio of the hydroxystyrene moiety of formula [9] to the monomethylolated precursor [3] is from about 1:1 to about 1:3, most preferably about 1:2. A preferred molar ratio of each repeating unit of the poly(hydroxystyrene) precursor [2] to the monomethylolated precursor [3] is also from about 1:1 to about 1:3, most preferably about 1:2. The reaction time may vary considerably, preferably from about 4 to about 24 hours. The reaction products for each reaction may be recovered by any conventional means. Recovery means such as recrystallization or reprecipitation are suitable methods.

The preferred para-hydroxystyrene monomer modified with the monomethylolated oligomeric precursor have the structure defined by formula [4]:

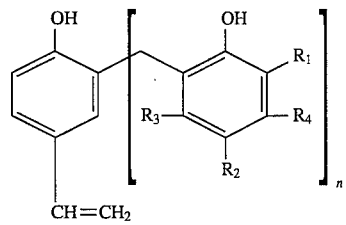

where n is an integer of 1 or 2.

The oligomer [4] could be further polymerized by any method of vinyl polymerization such as radical polymerization, cation polymerization, anion polymerization, plasma polymerization, and the like. However, due to steric hindrance and a chain termination reaction with the reactive phenolic hydroxyl group, the polymerization may be difficult. In particular, to avoid the chain termination reaction of a growing polymer chain radical on the vinyl group of the oligomer with the reactive hydroxyl group on the same molecule, cation polymerization with the additional presence of a polymerization initiator is recommended. Any suitable process parameter may be used to make the desired polymer having desired molecular weight, molecular weight distribution, and microstructures suitable to the improved dissolution behavior. Preferred initiators for this polymerization are $BF_3$—$ET_2O$, $AlCl_3$, $TiCl_4$, $SnCl_4$, $H_2SO_4$, $H_3PO_4$, $CF_3COOH$, as well as other Lewis acids or protonic acids.

Other reaction conditions for this polymerization may also be used. Previously published methods for the cation polymerization of hydroxystyrene derivatives are described in Japanese Patent No. 46,021,213 (1971) and in U.S. Pat. No. 4,032,513 (1989).

The oligomer [4] may also be copolymerized with other comonomers, including the following vinyl monomers: acrylic acid, methacrylic acid, methyl acrylate, methyl methacrylate, maleic anhydride, vinyl acetate, acrylonitrile, acrylamide, methacrylamide, and other monomers containing a polar group.

The above-discussed resins of the present invention are mixed with the following components to make a photoresist composition:

(1) One or more photoacid generator, (2) One or more dissolution inhibitor, (3) One or more solvent, as well as (4) Optionally, speed enhancers, (5) Optionally, anti-striation agents, and (6) Optionally, anti-halation agent.

(7) Optionally, plasticizers.

Photoacid generators (PAG) form acid moieties under irradiation of UV light including deep UV region to cleavage protecting groups from dissolution inhibitors so that the dissolution rate of the photoresist films can be increased in an exposed area to make a positive-tone photoimage. The photoacid generating compound is preferably selected from a family of the compounds which generate small acidic molecules having pKa less than 4. PAG's useful for the above purpose may be selected from various onium salts, halogen-containing compounds, and sulfonates including the following:

[I] Onium salts: Triphenylsulfonium tetrafluoroborate, Triphenylsulfonium hexafluoroantimonate, Triphenylsulfonium hexafluoroarsenate, Triphenylsulfonium hexafluorophosphate, Triphenylsulfonium trifluorosulfonate, 4-Thiophenoxydiphenylsulfonium tetrafluoroborate, 4-Thiophenoxydiphenylsulfonium hexafluoroantimonate, 4-Thiophenoxydiphenylsulfonium hexafluoroarsenate, 4-Thiophenoxydiphenylsulfonium hexafluorophosphate, 4-Thiophenoxydiphenylsulfonium triuorosulfonate, 4-tert-Butylphenyldiphenysulfonium tetrafluoroborate, 4-tert-Butylphenyldiphenysulfonium hexafluoroantimonate, 4-tert-Butylphenyldiphenysulfonium hexafluoroarsenate, 4-tert-Butylphenyldiphenysulfonium hexafluorophosphate, 4-tert-Butylphenyldiphenysulfonium trifluorosulfonate, Tris(4-methylphenyl)sulfonium tetrafluoroborate, Tris(4-methylphenyl)sulfonium hexafluoroantimonate, Tris(4-methylphenyl)sulfonium hexafluoroarsenate, Tris(4-methylphenyl)sulfonium hexafluorophosphate, Tris(4-methylphenyl)sulfonium trifluorosulfonate, Tris(4-methoxyphenyl)sulfonium tetrafluoroborate, Tris(4-methoxyphenyl)sulfonium hexafluoroantimonate, Tris(4-methoxyphenyl)sulfonium hexafluoroarsenate, Tris(4-methoxyphenyl)sulfonium hexafluorophosphate, Tris(4-methoxyphenyl)sulfonium trifluorosulfonate, Diphenyliodinium tetrafluoroborate, Diphenyliodinium hexafluoroantimonate, Diphenyliodinium hexafluoroarsenate, Diphenyliodinium hexafluorophosphate, Diphenyliodinium trifluorosulphonate, 3,3'-Dinitrodiphenyliodinium tetrafluoroborate, 3,3-'Dinitrodiphenyliodinium hexafluoroantimonate, 3,3'-Dinitrodiphenyliodinium hexafluoroarsenate, 3,3'-Dinitrodiphenyliodinium trifluorosulphonate, 4,4'-Dimethyldiphenyliodinium tetrafluoroborate, 4,4'-Dimethyldiphenyliodinium hexafluoroantimonate, 4,4'-Dimethyldiphenyliodinium hexafluoroarsenate, 4,4'-Dimethyldiphenyliodinium trifluorosulphonate.

[II] Halogen-containing compounds: 2,4,6-Tris(trichloromethyl)triazine; 2-Allyl-4,6-bis(trichloromethyl)triazine; $\alpha,\beta,\alpha$-Tribromomethylphenylsulfone; $\alpha,\alpha,2,3,5,6$-Hexachloroxylene; 2,2-Bis(3,5-dibromo- 4-hydroxyphenyl)-1,1,1,3,3,3-hexafluoropropane; 1,1,1-Tris(3,5-dibromo-4-hydroxyphenyl)ethane.

[III] Sulfonates: 2-Nitrobenzyl tosylate; 2,6-Dinitrobenzyl tosylate; 2,4-Dinitrobenzyl tosylate; 2-Nitrobenzyl methylsulfonate; 2-Nitrobenzyl acetate; p-Nitrobenzyl 9,10-dimethoxyanthracene-2-sulfonate; 1,2,3-Tris(methanesulfonyloxy)benzene; 1,2,3-Tris(ethanesulfonyloxy)benzene; 1,2,3-Tris(propanesulfonyloxy)benzene. These PAG may be used singly or in combination. Other suitable PAG may also be used.

Dissolution inhibitors tend to control the dissolution rate of the photoresist composition films, particularly to inhibit the dissolution of the resist films in unexposed areas, while they can be deprotected by acid moieties generated from PAG under irradiation to enhance the dissolution rate of the resist films in exposed areas. These inhibitors are selected from various speed enhancers protected with various protecting groups such as t-BOC, THP, silyl ether group, tertiary butyl group, and so on. Preferably, the alkaline dissolution inhibitor is selected from a family of oligomeric phenolic compounds having a molecular weight from 200 to 1,000, the hydroxyl groups of which are protected with substituents which can be deprotected in the presence of acidic compounds releasing small molecules having a molecular weight from about 20 to about 100 which do not affect the dissolution of the radiation-sensitive composition in alkali developers. In particular, good candidates of the backbones of the dissolution inhibitor for this purpose may be phenolic oligomers such as 1-[1'-methyl-1'-(4'-hydroxyphenyl)ethyl]- 4-[1',1'-bis(4-hydroxyphenyl)-ethyl]-phenol (also known as TRISP-PA), 2,6-bis[(2,3,4-trihydroxyphenyl)methylene]-4-methylphenol, or their derivatives.

Preferably, the alkali-soluble binder resin is from about 90% to about 40% by weight of the solids in said radiation-sensitive composition. Preferably, the alkaline dissolution inhibitor is from about 5% to 30% by weight of the solids of said radiation-sensitive composition. And preferably, the photoacid generating compound is from about 5% to 30% by weight of the solids of said radiation sensitive composition.

These radiation-sensitive mixtures may also contain conventional photoresist composition ingredients such as other resins, solvents, actinic and contrast-enhancing dyes, anti-striation agents, plasticizers, speed enhancers, and the like. These additional ingredients may be added to the binder resin and sensitizer solution before the solution is coated onto the substrate.

Other binder resins may also be added beside the resins of the present invention mentioned above. Examples include phenolic-formaldehyde resins, cresol-formaldehyde resins, phenol-cresol-formaldehyde resins and poly(hydroxysytrene) resins commonly used in the photoresist art. Haloacetaldehyde and other aldehyde sources may be used instead of formaldehyde for making these optional resins. If other binder resins are present, they will replace a portion of the binder resins of the present invention. Thus, the total amount of the binder resin in the radiation-sensitive composition will be from about 60% to about 95% by weight of the total nonvolatile solids content of the radiation-sensitive composition.

The three critical ingredients are generally dissolved in a solvent or solvents to facilitate their application to the substrate. Examples of known photoresist solvents include methoxyacetoxy propane, ethyl cellosolve acetate, n-butyl acetate, cyclopentanone, cyclohexanone, methyl ethyl ketone, diglyme, ethylene glycol monomethyl ether, ethylene glycol monoethyl ether, methyl lactate ethyl lactate, ethyl 3-ethoxy propionate, propylene glycol alkyl ether acetates, xylene, or mixtures thereof and the like. One preferred solvent is ethyl lactate alone or in combination with ethyl 3-ethoxy propionate. The preferred amount of solvent may be from about 50 to about 500%, or higher, by weight, more preferably, from about 100 to about 400% by weight, based on combined resin and sensitizer weight.

Actinic dyes help provide increased resolution on highly reflected surfaces by inhibiting back scattering of light off the substrate. This back scattering causes the undesirable effect of optical notching, especially on a substrate topography. The amount of actinic dyes may be up to 10% weight levels, based on the combined weight of resin, and dissolution inhibitor and photoacid generator.

Contrast dyes enhance the visibility of the developed images and facilitate pattern alignment during manufacturing. Contrast dye additives may be used together with the radiation-sensitive mixtures of the present invention up to 10% weight levels, based on the combined weight of resin, dissolution inhibitor and photoacid generator.

Anti-striation agents level out the photoresist coating or film to a uniform thickness. Anti-striation agents may be used up to 5% weight levels, based on the combined weight of resin and sensitizer. One suitable class of anti-striating agents is nonionic silicon-modified polymers. Nonionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-β-chloroethyl)-ester; stearic acid; dicamphor; polypropylene; acetal resins; phenoxy resins; and alkyl resins up to 10% weight levels, based on the combined weight of resin, dissolution inhibitor, and photoacid generator.

Speed enhancers tend to increase the solubility of the photoresist coating in both the exposed and unexposed areas, and thus, they are used in applications where speed of development is the overriding consideration even though some degree of contrast may be sacrificed, i.e., in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid, or nitrocinnamic acid at weight levels of up to 20%, based on the combined weight of resin and sensitizer. Other known speed enhancers include polyhydroxy compounds such as resorcinol, phloroglucinol, 2,3,4-trihydroxybenzophenone, 2,3,4,4'-tetrahydroxybenzophenone, 2,3,4,3',4',5'-hexahydroxybenzophenone, acetone pyrogallol condensate resins, and the like. Preferred speed enhancers include 2,6-bis[(2,3,4-trihydroxyphenyl)methylene]-4-methylphenol, and 1-[1'methyl-1'-(4'-hydroxyphenyl)ethyl] 4-[1',1'-bis( 4-hydroxyphenyl)ethyl] (also known as phenol, 4,4'-[1-[4-[1-(4-hydroxyphenyl)-1-methylethyl]phenyl]ethylidene]bis-or TRISP-PA). (This latter compound has CAS No. 110 726-28-8.)

The prepared radiation-sensitive resist mixture, can be applied to a substrate by any conventional method used in the photoresist art, including dipping, spraying, whirling, and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum, or polymeric resins, silicon dioxide, doped silicon dioxide, silicon resins, gallium arsenide, silicon nitride, tantalum, copper, polysilicon, ceramics, and aluminum/copper mixtures.

The use of the resist material of the present invention involves the coating of wafers to be processed. These resist materials are typically coated onto a substrate, e.g., a semiconductor based wafer such as silicon or GaAs wafer that is being processed to form semiconductor devices and exposed to ultraviolet light, electron beam, or X-ray to delineate a patterns for a subsequent process such as an etching or metallization process. It should be emphasized that during the processing of semiconductor wafers it is possible to form the photosensitive body by depositing the resist on a substrate surface that includes a semiconductor material, an insulator, such as a silicon oxide or a metal, or a combination of the semiconductor materials and insulators. Exemplary of other suitable substrates are chromium mask blanks and X-ray mask blanks. Any conventional coating process may be employed. Typically, the polymer is dissolved in a suitable solvent and the solution is filtered and then placed on the wafer to be coated, and the wafer is spun. The spinning procedure distributes the solution essentially uniformly over the surface of the wafer, and also causes the evaporation of substantially all of the solvent. In this manner, films in the thickness of about 1.0–2.0 μm (representative of thickness employed in lithography) may be produced on an appropriate substrate material.

After coating, the material is preferably prebaked to remove any remaining solvent. Pre-exposure baking temperatures in the range from 70° to 105° C. for times in the range from 15 to 60 minutes are desirable. The resist material is then exposed to energy such as deep UV light, X-rays, or electron beam. Typical doses in the range from 50 to 250 mjoules/cm$^2$ for deep UV light are employed. (Corresponding doses for electron beam and X-ray irradiation are useful). Conventional exposure techniques such as described in "Introduction to Microlithography", eds L. F. Thompson, C. G. Wilson, and M. J. Bowden, ACS Symposium, Series 219, pp. 16–82 (1983), Washington, D.C., are employed to delineate the photosensitive material. It is then desirable to post-bake the exposed materials. This post-baking enhances the cleavage reaction of chain substituents with the generated acid. Generally, post-bake temperatures in the range from 70° to 115° C. for time periods from 20 seconds to 30 minutes are effective. Although heating means such as a convection oven are useful, better image quality is obtained using a hot plate baking apparatus such as sold by Brewer Sciences. Solvents suitable for developing the exposed image are materials such as water/tetramethylammonium hydroxide, water/NaOH or mixtures of lower alkyl alcohols such as isopropanol, ethanol, and methanol with or without water for a positive image and hexane/methylene chloride for a negative image. Generally, immersion in the developer for time periods from 20 seconds to 2 minutes produces the desired delineation.

The present invention is further described in detail by means of the following Examples and Comparisons. All parts and percentages are by weight and all temperatures are degrees Celsius unless explicitly stated otherwise.

Synthesis 1

Poly(p-hydroxystyrene), hereafter abbreviated by PHS, which was obtained from Maruzen Petroleum Chemicals Co., Ltd. having a weight average molecular weight of 4,087, was placed by 8.17 g (0.068 moles) in a 2-liter flask equipped with mechanical stirrer and condenser. 2,4-Dimethyl-6-methylolphenol, hereafter abbreviated by HMX, was added by 32.76 g (0.234 moles) with 200 g of acetic acid to the PHS. After all solids were dissolved, the reaction mixture was heated to 100° C. with agitation for 24 hours. Then, the temperature was decreased to 50°–60° C. and 2,000 g of hexane was slowly added to the reaction solution with vigorous stirring over 30 minutes followed by additional stirring at the same temperature for 30 minutes. The solution was then kept standing at room temperature to precipitate the resulting polymers. After removing the supernatant, the precipitate was dissolved in 20 g of acetone and reprecipitated into 200 g of hexane at room temperature. The reprecipitation was repeated twice. The product was dried in vacuum at 40°–50° C. for a couple of days.

Yield of the product was 14.54 g which is equivalent to 178% of recovery yield to the amount of PHS charged. A degree of introduction of HMX to PHS was determined by H-NMR to be 56% per the reaction site at the ortho-position of the phenolic ring of PHS. Molecular weight of the resulting polymer was 6,028 with a polydispersivity of 2.4. A dissolution rate (A/sec) of the resulting polymer in 0.262N of tetramethylammonium hydroxide aqueous solution was determined by Dissolution Rate Monitor System to be 41 which is 76 times slower than that of the original PHS.

Syntheses 2–6

The same reaction as described in Synthesis 1 was carried out except that the reaction time was changed from 24 hours to various times as described in Table 1.

TABLE 1

| Syntheses No. | PHS (g) | HMX (g) | Acetic Acid (g) | Time (h) | Yield (g) | $M_w$ | $P_d$ |
|---|---|---|---|---|---|---|---|
| 1 | 8.17 | 32.76 | 200 | 24 | 14.54 | 6,028 | 2.40 |
| 2 | 8.18 | 32.64 | 200 | 5 | 9.62 | 4,699 | 2.13 |
| 3 | 8.16 | 32.65 | 200 | 15 | 11.61 | 5,345 | 2.67 |
| 4 | 8.19 | 32.72 | 200 | 2 | 9.36 | 4,627 | 2.68 |
| 5 | 8.21 | 32.76 | 200 | 48 | 18.71 | 7,275 | 2.98 |
| 6 | 8.16 | 36.76 | 200 | 72 | 20.65 | 7,900 | 3.45 |

Synthesis 7

PHS having molecular weight of 5,200 obtained from Maruzen (24.03 g), HMX (6.09 g), and sulfuric acid (96% solution) (0.21 g) was dissolved in 100 ml of methanol at room temperature. Then, the resulting solution was refluxed for 5 hours. After cooling to room temperature, the solution was poured into 2,000 ml of water to precipitate the resulting polymer, followed by filtration. The precipitate was dissolved in 100 ml of acetone and then 500 ml of hexane was slowly added to the solution with vigorous stirring for 60 minutes. The top layer was separated by suction and the bottom layer was dried in vacuum. The product was redissolved in 100 ml of acetone and poured into 1,500 ml of water for further precipitation. Yield of the resulting polymer, light brown powder, was 25.1 g.

Syntheses 8–12

The same reaction, as described in Synthesis 7, was carried out except that the molar ratio of HMX to PHS and others were changed as described in Table 2.

TABLE 2

| Synthesis No. | HMX/PHS | HMX (g) | MeOH (ml) | $H_2SO_4$ (g) | Acetone (ml) | Hexane (ml) | Yield (g) |
|---|---|---|---|---|---|---|---|
| 7 | 0.200 | 6.09 | 100 | 0.21 | 100 | 500 | 25.1 |
| 8 | 0.435 | 12.18 | 120 | 0.41 | 120 | 500 | 28.1 |
| 9 | 0.600 | 18.26 | 140 | 0.61 | 140 | 500 | 29.8 |
| 10 | 0.800 | 24.35 | 160 | 0.82 | 160 | 500 | 31.1 |
| 11 | 1.000 | 30.44 | 180 | 1.02 | 180 | 600 | 33.6 |
| 12 | 2.000 | 60.88 | 280 | 2.04 | 280 | 950 | 38.3 |

Synthesis 13

1,3,3',5-Tetra-(4-hydroxyphenyl)pentane, (THPP), 8.8 g (0.02 moles), was dissolved in 120 ml of N,N-dimethylacetamide. Then, 14.1 g (0.10 mole) of potassium carbonate and 17.4 g (0.09 mole) of tert-butyl-bromoacetic acid were added to the above solution. The reaction mixture was heated at 120° C. for 7 hours. The reaction solution was poured into 1,500 ml of water and extracted with a sufficient amount of ethyl acetate. The organic solution phase was separated and dried with magnesium sulfate overnight. The solution was then condensed to some extent followed by purification by column chromatography where a silica gel column with ethyl acetate/n-hexane admixture at volume ratio of 20/80 was used. Yield of the product, white powder was 14.3 g (80%).

A degree of the esterification of the phenolic hydroxyl group of THPP was determined by NMR to be 100% as shown in Equation [5]:

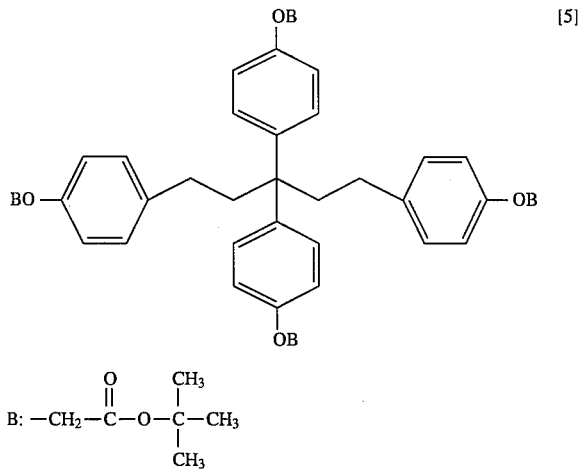

Synthesis 14

The same reaction, as described in Synthesis 13, was carried out except that the molar ratio of tert-butylbromoacetic acid to THPP was changed from 4.5 to 3.5. The resulting product was characterized to have a degree of the esterification of 87.5%

Syntheses 15–18

Silica gel, Aldrich 28862 (60A in pore size; 0.75 cm3/g in surface area (100 g), was dispersed in 200 g of acetone with vigorous stirring at room temperature. A mixture of concentrated sulfuric acid (2 ml) and acetone (18 ml) was slowly added to the silica suspension and stirred at room temperature for 1 hour. The solvent was then evaporated under reduced pressure at 45° C. for 4 hours to obtain dried $H_2SO_4$-immobilized silica gel.

1-[1'-Methyl-1'-(4-hydroxyphenyl)ethyl]-4-[1',1'-bis(4-hydroxyphenyl)-ethyl]-phenol also known as (TRISP-PA), [36.0 g (87.5 mole)], was dissolved in 100 g of tetrahydrofuran and the $H_2SO_4$-immobilized silica gel (1.2 g), was added to the solution. 3,4-Dihydro-2H-pyran, [44.1 g (524 mole)], was slowly added to the solution with vigorous stirring at room temperature. The reaction mixture was further stirred at room temperature for different periods of time. The silica gel particles were removed by filtration, followed by neutralization with added a few drops of triethylamine. The 3,4-dihydro-2H-pyran at 55°–60° C. under reduced pressure, followed by drying in vacuum at 55°–60° C. for 1–2 days.

Table 3 shows HPLC analytical results of the products obtained for different reaction times. Peaks 1–3 can be assigned to mono-, di-, and tri-substituted TRISP-PA with dihydropyranyl group, respectively. The tri-substituted TRISP-SA is illustrated by Equation [6].

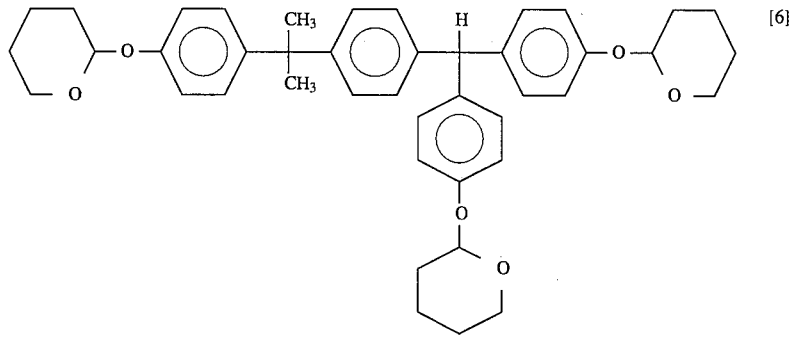

[6]

TABLE 3

| Synthesis No. | Reaction Time (min.) | Peak 1 | Peak 2 | Peak 3 | TRISP-PA |
|---|---|---|---|---|---|
| 15 | 15 | 47.5 | 21.6 | 0 | 30.0 |
| 16 | 30 | 37.3 | 38.5 | 11.7 | 12.2 |
| 17 | 60 | 19.3 | 45.9 | 32.5 | 1.9 |
| 18 | 180 | 1.3 | 16.5 | 80.0 | 0 |

Resist Examples 1–4

Various resist compositions were formulated as shown in Table 4 using the binder resins, the inhibitors prepared above in combination of triphenylsulfonium trifluoromethylsulfate as a photoacid generator (PAG) with or without a speed enhancer.

The resist solutions were filtered with an 0.2 micron pore size of membrane filter and spun coat onto silicon wafers at 3,000 rpm of spin speed to adjust a film thickness at 1.0 micron. Baking, exposure, and development were carried out under the condition as described in Table 4. The results of lithography are also shown in Table 5.

TABLE 4

| Example No. | Resin *1 | Inhibitor *2 | PAG | SEN *3 | Solvent *4 |
|---|---|---|---|---|---|
| 1 | 5.400 | ADM/partial (1.500) | 0.225 | None | 22.5 |
| 2 | 3.672 | ADM/full (1.275) | 0.153 | None | 14.6 |
| 3 | 3.488 | ADM/full (1.275) | 0.153 | BPCH (0.184) | 14.6 |
| 4 | 3.305 | ADM/full (1.275) | 0.153 | BPCH (3.305) | 14.6 |

Footnotes:
The numbers in the table indicate a weight of the materials in gram.
*1 = Resin is the product of Synthesis 8.
*2 = Inhibitor, ADM/partial, is the product of Synthesis 14; degree of esterification = 87.5%; Inhibitor, ADM/full is the product of Synthesis 13; degree of esterification = 100%.
*3 = Speed enhancer (SEN), BPCH, is the compound described by Equation [13].
*4 = Solvent, ECA, is ethyl cellusolve acetate.

The conditions for the prebake, post exposure bake (PIB) and development for resist Examples 1–4 are given in Table 5 as well as the measured results $E_{opt}$ and Resolution.

TABLE 5

| Ex. No. | Pre-bake | PEB | Dev. | $E_{opt}$ (mJ) | Res (μm) | NA | OD248 |
|---|---|---|---|---|---|---|---|
| 1 | 120° C. 60 sec | 100° C. 60 sec. | 1.19% TMAH 60 sec | 9 | 0.26 | 0.50 | 0.56 |
| 2 | Same | Same | Same | 15 | 0.28 | 0.45 | 0.49 |
| 3 | Same | Same | Same | 11 | 0.28 | 0.45 | 0.51 |
| 4 | Same | Same | Same | 9 | 0.30 | 0.45 | 0.52 |

Footnote:
$E_{opt}$ is an exposure does to clear a mask pattern at 0.4 μm; Res is a resolution cleared at the same dosage as defined by $E_{opt}$. NA stands for numerical aperture of the stepper employed and OD24 stands for the optical density (absorbance) at 248 nanometers.

Example 5

The modified PHS prepared by Synthesis No. 1, 6.01 g, was dissolved in 24.0 g of ethyl lactate. The inhibitor prepared by Synthesis No. 18 was added to 5.0 g of the polymer solution at different concentrations of 20, 30, and 40 wt. % to the solid polymer in solution, and further was tetrahydrofuran, 6.309.3 g, added to the solution to completely dissolve the inhibitor. The solutions were spun coated onto a quartz disk by spin-coating at 4.00K rpm for 30 seconds at room temperature. Thus coated quartz disks were heated at 100° C. for 30 minutes in a convection oven to evaporate the solvents. The films were developed with 0.262 N TMAH developer by placing the developer solution on the coated disks for different times at room temperature, followed by rinsing with water. A ratio of the bulk dissolution rate of the film of the polymer with the inhibitor to that of the film without the inhibitor was calculated as dissolution inhibition. There was a concentration dependency of the inhibitor on the dissolution inhibition.

Based on the inhibition test, the following resist composition was formulated:

(1) The same polymer as described above, 3.50 g.
(2) The same inhibitor as described above, 1.25 g.
(3) The same PAG as used in Examples 1–4, 0.15 g.
(4) Speed enhancer described in synthesis (THPP), 0.20 g.
(5) Solvent, ECA, 15.0 g.

The resulting resist solution was filtered with an 0.2 μm-pore size membrane filter and then spun coat onto silicon wafers to make 1.0-μm thick film. The conditions of the baking, exposure, and development were the same as described in Resist Example 1. Resolution and sensitivity ($E_{opt}$) the resulting photoimage were 0.25 μm and 10 mJ, respectively.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A process for fabricating a semiconductor device comprising the steps of:

(1) forming a radiation-sensitive region on a device substrate;

(2) exposing said region to said radiation to form a pattern;

(3) developing said pattern; and (4) employing said pattern to define areas of said device;

wherein said radiation-sensitive region is a radiation-sensitive composition comprising in admixture:

(a) an alkali-soluble binder resin made by a condensation reaction of:

(i) hydroxy styrene moiety having formula [1] or [2]:

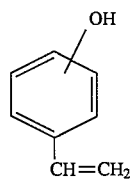

[1]

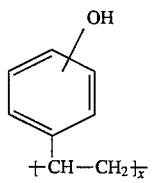

[2]

wherein x is an integer from 2 to 300; with (ii) a monomethylolated phenolic compound having a formula [8]:

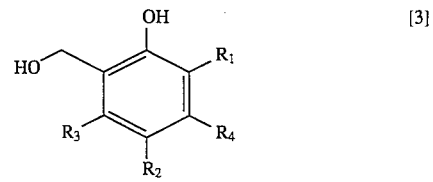

[3]

wherein $R_1$ and $R_2$ are individually selected from the group consisting of lower alkyl group having 1–4 carbon atoms, lower alkoxy group having 1–4 carbon atoms, amino group, and carboxylic acid group; wherein $R_3$ and $R_4$ are individually selected from the group consisting of hydrogen, lower alkyl group having 1–4 carbon atoms, lower alkoxy groups having 1–4 carbon atoms, an amino group, and a carboxylic group; and wherein a mole ratio of the hydroxystyrene moiety to the monomethylolated phenolic compound is from about 1:10 to about 10:1;

(b) at least one alkaline dissolution inhibitor containing acid-cleavable groups; and (c) at least one compound that results in the generation of an acidic moiety under irradiation.

2. The process of claim 1 wherein said hydroxy styrene is poly (para-hydroxystyrene).

3. The process of claim 1 wherein said monomethylolated phenolic compound is 2,4-dimethyl-6-methylolphenol.

4. The process of claim 1 wherein said alkali-soluble binder resin (a) is from about 90% to about 40% by weight of the solids in said radiation-sensitive composition.

5. The process of claim 1 wherein said alkaline dissolution inhibitor (b) is selected from a family of oligomeric phenolic compounds having a molecular weight from 200 to 1,000, the hydroxyl groups of which are protected with substituents which can be deprotected in the presence of acidic compounds releasing small molecules having a molecular weight from about 20 to about 100 which do not affect the dissolution of the radiation-sensitive composition in alkali developers.

6. The process of claim 1 wherein said alkaline dissolution inhibitor (b) is from about 5% to about 30% by weight of the solids of said radiation-sensitive composition.

7. The process of claim 1 wherein said acid generating compound (c) is selected from a family of the compounds which generate small acidic molecules having pKa less than 4.

8. The process of claim 1 wherein said acid generating compound (c) is from about 5% to 30% by weight of the solids of said radiation-sensitive composition.

9. The process of claim 1 wherein said radiation comprises ultraviolet radiation.

10. The process of claim 1 wherein the source of said radiation comprises an excimer laser.

11. The process of claim 1 wherein said radiation-sensitive region is formed by coating said device substrate with the radiation-sensitive composition and spinning said coated device substrate.

12. The process of claim 1 wherein said step of employing said pattern comprises etching or metallization.

* * * * *